(12) United States Patent
Liang et al.

(10) Patent No.: US 9,996,415 B2
(45) Date of Patent: *Jun. 12, 2018

(54) DATA CORRECTING METHOD, MEMORY CONTROL CIRCUIT UNIT, AND MEMORY STORAGE DEVICE

(71) Applicant: PHISON ELECTRONICS CORP., Miaoli (TW)

(72) Inventors: Ming-Jen Liang, Hsinchu (TW); Kheng-Chong Tan, Miaoli (TW)

(73) Assignee: PHISON ELECTRONICS CORP., Miaoli (TW)

( * ) Notice: Subject to any disclaimer, the term of this patent is extended or adjusted under 35 U.S.C. 154(b) by 94 days.

This patent is subject to a terminal disclaimer.

(21) Appl. No.: 15/182,609

(22) Filed: Jun. 15, 2016

(65) Prior Publication Data

US 2017/0300379 A1    Oct. 19, 2017

(30) Foreign Application Priority Data

Apr. 18, 2016   (TW) .............................. 105112047 A

(51) Int. Cl.
| | | |
|---|---|---|
| *G11C 29/00* | (2006.01) | |
| *G06F 11/10* | (2006.01) | |
| *G06F 3/06* | (2006.01) | |
| *G11C 29/52* | (2006.01) | |

(52) U.S. Cl.
CPC ........ *G06F 11/1068* (2013.01); *G06F 3/0604* (2013.01); *G06F 3/064* (2013.01); *G06F 3/0619* (2013.01); *G06F 3/0631* (2013.01); *G06F 3/0632* (2013.01); *G06F 3/0656* (2013.01); *G06F 3/0679* (2013.01); *G11C 29/52* (2013.01); *G11C 29/70* (2013.01)

(58) Field of Classification Search
CPC .. G06F 3/0604; G06F 11/1068; G06F 3/0679; G06F 3/0656; G06F 3/064; G06F 3/0632; G06F 3/0631; G06F 3/0619; G11C 29/52
See application file for complete search history.

(56) References Cited

U.S. PATENT DOCUMENTS

| | | | | |
|---|---|---|---|---|
| 9,720,609 | B1* | 8/2017 | Yan .................. | G06F 3/0619 |
| 2012/0151301 | A1* | 6/2012 | Izumi ................ | G06F 11/1048 |
| | | | | 714/773 |
| 2015/0169401 | A1* | 6/2015 | Tseng ................ | G06F 11/1068 |
| | | | | 714/773 |
| 2015/0333774 | A1* | 11/2015 | Kaynak .............. | G06F 11/10 |
| | | | | 714/764 |

* cited by examiner

*Primary Examiner* — Guy Lamarre
(74) *Attorney, Agent, or Firm* — JCIPRNET

(57) ABSTRACT

A data correcting method for a rewritable non-volatile memory module is provided. The method includes: if a first user data read from a first physical programming unit cannot be corrected by a corresponding first parity code, reading at least one group parity code of a first encoded group that the first physical programming unit belongs to into a buffer, sending the group parity code to a correcting circuit, and reading a user data from physical programming units belonging to the first encoded group into the buffer and sending the user data and the group parity code to the correcting circuit in batches to obtain a corrected first user data corresponding to the first user data.

18 Claims, 7 Drawing Sheets

DATA CORRECTING METHOD, MEMORY CONTROL CIRCUIT UNIT, AND MEMORY STORAGE DEVICE

CROSS-REFERENCE TO RELATED APPLICATION

This application claims the priority benefit of Taiwan application serial no. 105112047, filed on Apr. 18, 2016. The entirety of the above-mentioned patent application is hereby incorporated by reference herein and made a part of this specification.

BACKGROUND

Technology Field

The present invention relates to a data correcting method, and more particularly, to a data correcting method for a rewritable non-volatile memory module, a memory control circuit unit, and a memory storage device.

Description of Related Art

Due to the rapid developments of digital cameras, cellular phones, and MP3 players in recent years, consumer demand for storage media has rapidly increased as well. Since a rewritable non-volatile memory module (such as a flash memory) has characteristics such as data non-volatility, power-saving, small size, and lack of mechanical structures, the rewritable non-volatile memory module is very suitable to be built into the various portable multimedia devices provided above.

In general, when user data is to be written into one physical programming unit of the rewritable non-volatile memory module, the memory control circuit unit generates an error correcting code corresponding to the user data and writes the user data and the corresponding error correcting code into the same programming unit together. However, when the user data in the physical programming unit is read, the read data may not be corrected due to excessive bit error (such as the error bit number exceeds the error bit number of the error checking and correcting circuit). Therefore, how to send the correct data to the host system when the user data cannot be corrected based on the error correcting code in the physical programming unit is an object for those skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data correcting method, a memory control circuit unit, and a memory storage device capable of correcting data that cannot be corrected based on the parity code of a single physical programming unit by using a plurality of physical programming units under limited buffer space during data.

An exemplary embodiment of the present invention provides a data correcting method for a rewritable non-volatile memory module. The rewritable non-volatile memory module includes a plurality of physical programming units, and the physical programming units are grouped into a plurality of encoded groups. The data correcting method includes: reading a first user data from a first physical programming unit in the physical programming units and a first parity code corresponding to the first user data into a buffer, wherein the first physical programming unit belongs to a first encoded group in the encoded groups. The data correcting method further includes: reading at least one first group parity code from at least one other physical programming unit in the physical programming units into the buffer to send the first group parity code to a second correcting circuit and reading the user data from the physical programming units belonging to the first encoded group to the buffer in batches to send a plurality of corrected user data in the read user data to the second correcting circuit if a first correcting circuit cannot correct the first user data read from the first physical programming unit based on the read first parity code, wherein the first group parity code is generated by encoding a plurality of user data stored in the physical programming units of the first encoded group. The data correcting method further includes obtaining a corrected first user data corresponding to the first user data by decoding the corrected user data and the first group parity code in batches via the second correcting circuit and outputting the corrected first user data corresponding to the first user data.

An exemplary embodiment of the present invention provides a memory control circuit unit for controlling a rewritable non-volatile memory module, wherein the rewritable non-volatile memory module includes a plurality of physical programming units. The memory control circuit unit includes a host interface coupled to a host system, a memory interface coupled to the rewritable non-volatile memory module, an error checking and correcting circuit including a first correcting circuit and a second correcting circuit, a buffer, and a memory management circuit. A memory management circuit is coupled to the host interface, the error checking and correcting circuit, the memory interface, the error checking and correcting circuit, and the buffer. The memory management circuit is configured to group the physical programming units into a plurality of encoded groups. The memory management circuit is further configured to read a first user data from a first physical programming unit in the physical programming units and a first parity code corresponding to the first user data into a buffer, wherein the first physical programming unit belongs to a first encoded group in the encoded groups. Moreover, the first correcting circuit of the error checking and correcting circuit is configured to correct the first user data based on the first parity code. If the first correcting circuit cannot correct the read first user data from the first physical programming unit based on the read first parity code, the memory management circuit is further configured to read at least one first group parity code from at least one other physical programming unit in the physical programming units into the buffer to send a first group parity code to the second correcting circuit and read the user data from the physical programming units belonging to the first encoded group into the buffer in batches to send a plurality of corrected user data in the read user data to the second correcting circuit, and the second correcting circuit decodes the corrected user data and the first group parity code in batches to obtain a corrected first user data corresponding to the first user data, wherein the first group parity code is generated by encoding a plurality of user data stored in the physical programming units of the first encoded group. Moreover, the memory management circuit is further configured to output the corrected first user data corresponding to the first user data received from the second correcting circuit to the host system.

An exemplary embodiment of the present invention provides a memory storage device including a connection interface unit coupled to the host system, a rewritable non-volatile memory module having a plurality of physical programming units, and the above memory control circuit unit.

Based on the above, the data correcting method, the memory control circuit unit, and the memory storage device of the invention can further correct data based on the group parity code stored in another physical programming unit under limited buffer space when the data read from the physical programming unit cannot be corrected based on the corresponding parity code thereof, so as to effectively increase the reliability of the memory storage device.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
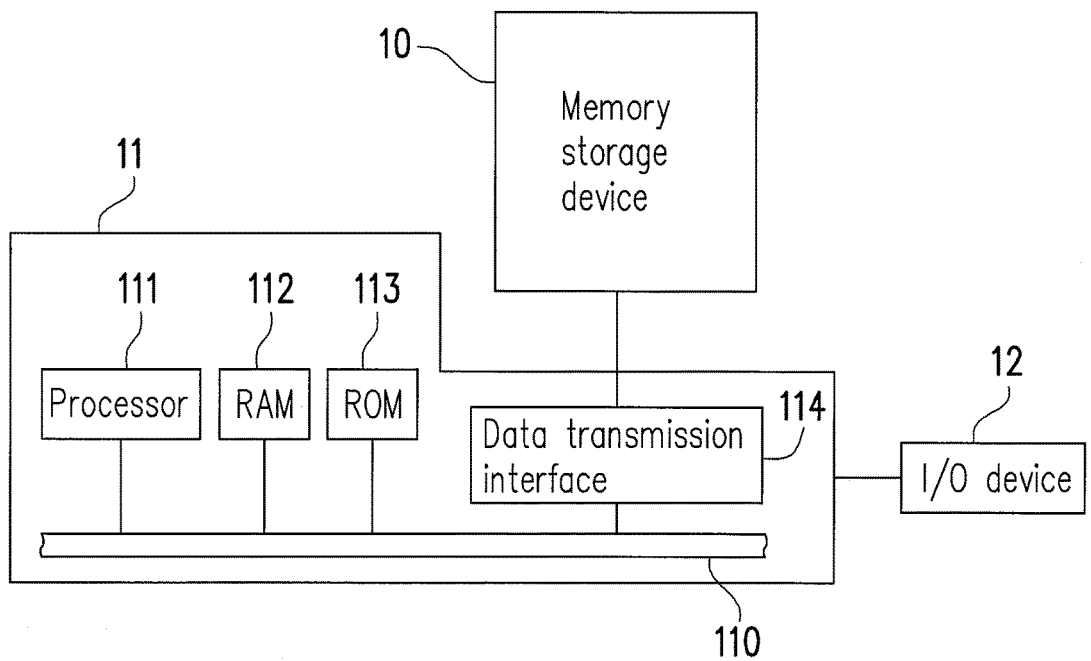
FIG. 1 is a schematic of a host system, a memory storage device, and an input/output (I/O) device shown according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (also referred to as a memory storage system) includes a rewritable non-volatile memory module and a controller (also referred to as a control circuit unit). The memory storage device is generally used with a host system, such that the host system can write data into the memory storage device or read data from the memory storage device.

Figure 2:
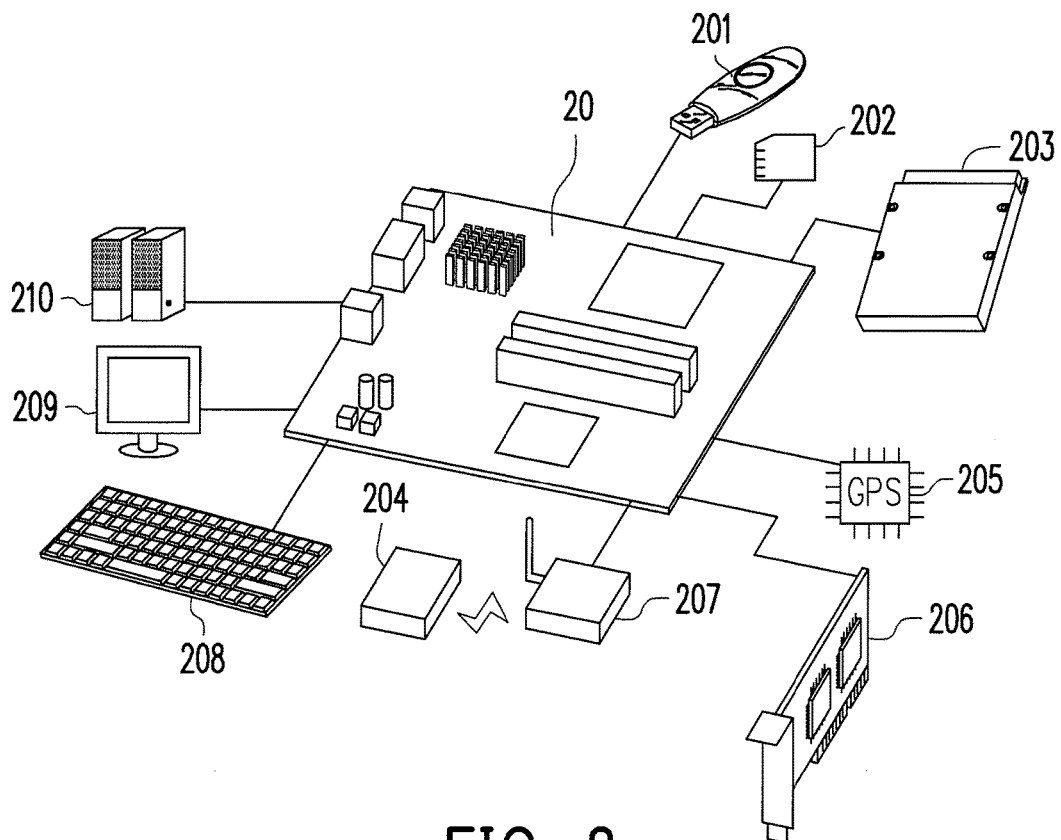
FIG. 2 is a schematic of a host system, a memory storage device, and an input/output (I/O) device shown according to another exemplary embodiment.

FIG. 1 is a schematic of a host system, a memory storage device, and an input/output (I/O) device shown according to an exemplary embodiment, and FIG. 2 is a schematic of a host system, a memory storage device, and an input/output (I/O) device shown according to another exemplary embodiment.

Referring to FIG. 1 and FIG. 2, a host system 11 generally includes a processor 111, a random access memory (RAM) 112, a read-only memory (ROM) 113, and a data transmission interface 114. The processor 111, the RAM 112, the ROM 113, and the data transmission interface 114 are all coupled to a system bus 110.

In the present exemplary embodiment, the host system 11 is coupled to the memory storage device 10 through the data transmission interface 114. For instance, the host system 11 can write data into the memory storage device 10 through the data transmission interface 114 or read data from the memory storage device 10. Moreover, the host system 11 is coupled to the I/O device 12 through the system bus 110. For instance, the host system 11 can send an output signal to the I/O device 12 or receive an input signal from the I/O device 12 through the system bus 110.

In the present exemplary embodiment, the processor 111, the RAM 112, the ROM 113, and the data transmission interface 114 may be disposed on a motherboard 20 of the host system 11. The quantity of the data transmission interface 114 may be one or a plurality. The motherboard 20 may be coupled to the memory storage device 10 in a wired or wireless method through the data transmission interface 114. The memory storage device 10 may be, for instance, a flash drive 201, a memory card 202, a solid state drive (SSD) 203, or a wireless memory storage device 204. The wireless memory storage device 204 may be, for instance, a memory storage device based on various wireless communication techniques such as a near-field communication (NFC) memory storage device, a wireless fax (WiFi) memory storage device, a bluetooth memory storage device, or a low-power bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 through the system bus 110. For instance, in an exemplary embodiment, the motherboard 20 may access the wireless memory storage device 204 through the wireless transmission device 207.

Figure 3:
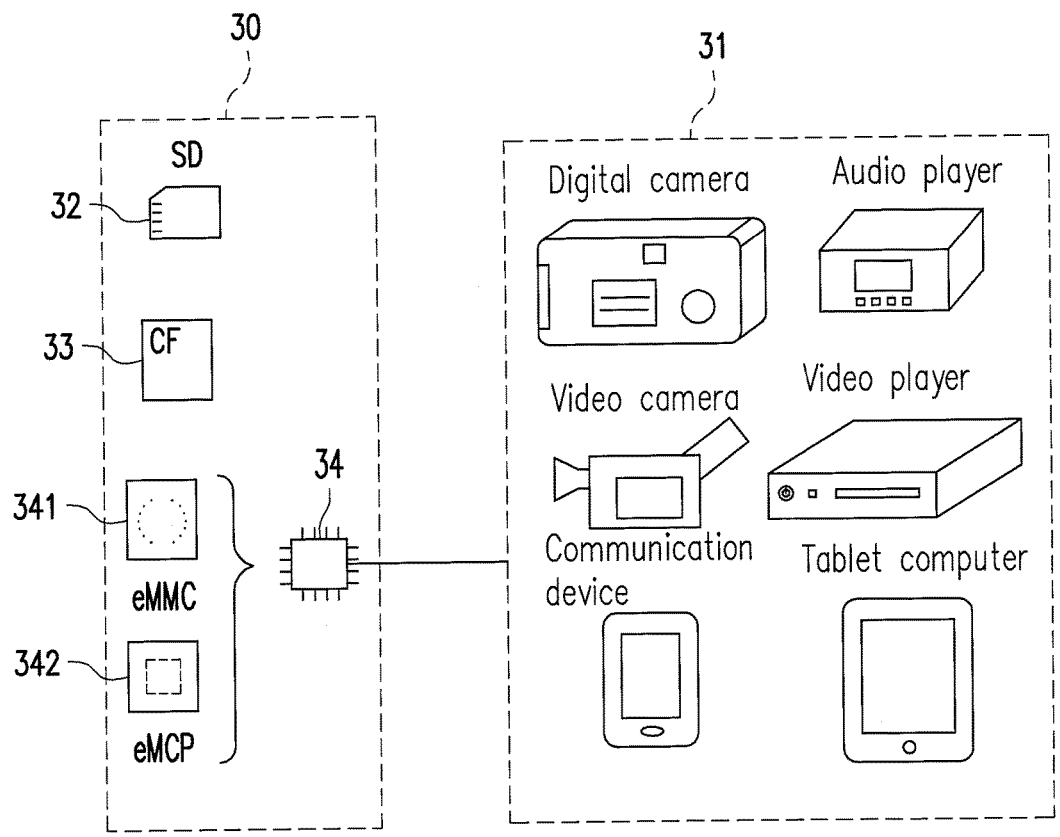
FIG. 3 is a schematic of a host system and a memory storage device shown according to another exemplary embodiment.

In an exemplary embodiment, the mentioned host system is any system that can substantially store data with the memory storage device. Although in the above exemplary embodiments, the host system is exemplified by a computer system, FIG. 3 is a schematic of a host system and a memory storage device shown according to another exemplary embodiment. Referring to FIG. 3, in another exemplary embodiment, the host system 31 may also be a system such as a digital camera, a video camera, a communication device, an audio player, a video player, or a tablet computer, and the memory storage device 30 may be various non-volatile memory storage devices used thereby such as a Secure Digital (SD) card 32, a CompactFlash (CF) card 33, or an embedded storage device 34. The embedded storage device 34 includes various types of embedded storage devices for which a memory module is directly coupled on the substrate of the host system, such as an embedded MMC (eMMC) 341 and/or an embedded multi-chip package (eMCP) 342.

Figure 4:
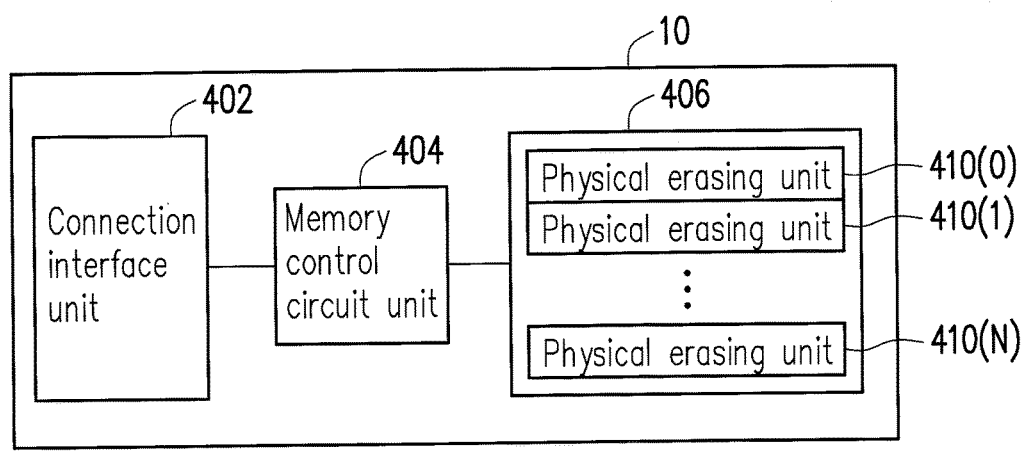
FIG. 4 is a schematic block diagram of a host system and a memory storage device shown according to an exemplary embodiment.

FIG. 4 is a schematic block diagram of a memory storage device shown according to an exemplary embodiment.

Referring to FIG. 4, the memory storage device 10 includes a connection interface unit 402, a memory control circuit unit 404, and a rewritable non-volatile memory module 406.

In the present exemplary embodiment, the connection interface unit 402 is compatible with the serial advanced technology attachment (SATA) standard. However, it should be understood that, the present invention is not limited thereto, and the connection interface unit 402 can also satisfy the parallel advanced technology attachment (PATA) standard, Institute of Electrical and Electronic Engineers (IEEE) 1394 standard, peripheral component interconnect express (PCI express) interface standard, universal serial bus (USB) standard, Ultra High Speed-I (UHS-I) interface standard, Ultra High Speed-II (UHS-II) interface standard, SD interface standard, memory sick (MS) interface standard, multi-chip package interface standard, multi media card (MMC) interface standard, embedded multimedia card (eMMC) interface standard, Universal Flash Storage (UFS) interface standard, embedded multi-chip package (eMCP) interface standard, CF interface standard, integrated device electronics (IDE) interface standard, or other suitable standards. In the present exemplary embodiment, the connection interface unit 402 may be packeted in a chip with the memory control circuit unit 404. Alternatively, the connection interface unit 402 is disposed outside of a chip containing the memory control circuit unit.

The memory control circuit unit 404 is configured to execute a plurality of logic gates or control instructions implemented in hardware form or firmware form and perform data operations such as writing, reading, and erasing in the rewritable non-volatile memory module 406 based on the commands of the host system 11.

The rewritable non-volatile memory module 406 is coupled to the memory control circuit unit 404 and is configured to store data written by the host system 11. The rewritable non-volatile memory module 406 has physical erasing units 410(0) to 410(N). Each of the physical erasing units respectively has a plurality of physical programming units, wherein physical programming units belonging to the same physical erasing unit can be independently written and erased at the same time. However, it should be understood that, the present invention is not limited thereto. Each of the physical erasing units may be formed by 64 physical programming units, 256 physical programming units, or any other number of physical programming units.

More specifically, the physical erasing unit is the smallest unit of erasing. That is, each of the physical erasing units contains the smallest number of memory cells erased together. The physical programming unit is the smallest unit of programming. That is, the physical programming unit is the smallest unit of data writing. Each of the physical programming units generally includes a data bit area and a redundancy area. The data bit area contains a plurality of physical access addresses configured to store user data, and the redundancy area is configured to store system data (for instance, control information and error-correcting code). In the present exemplary embodiment, the data bit area of each of the physical programming units contains 8 physical access addresses, and the size of one physical access address is 512 bytes. However, in other exemplary embodiments, the data bit area may also contain a greater or lesser number of physical access addresses, and the present invention does not limit the size and the number of the physical access address. For instance, in an exemplary embodiment, the physical erasing unit is a physical block, and the physical programming unit is a physical page or a physical sector, but the present invention is not limited thereto.

In the present exemplary embodiment, the rewritable non-volatile memory module 406 is a multi-level cell (MLC) NAND flash memory module (i.e., a flash memory module for which one memory cell can store 2 data bits). However, the present invention is not limited thereto, and the rewritable non-volatile memory module 406 may also be a single-level cell (SLC) NAND flash memory module (i.e., a flash memory module for which one memory cell can store 1 data bit), a trinary-level cell (TLC) NAND flash memory module (i.e., a flash memory module for which one memory cell can store 3 data bits), other flash memory modules, or other memory modules having the same characteristics.

Figure 5:
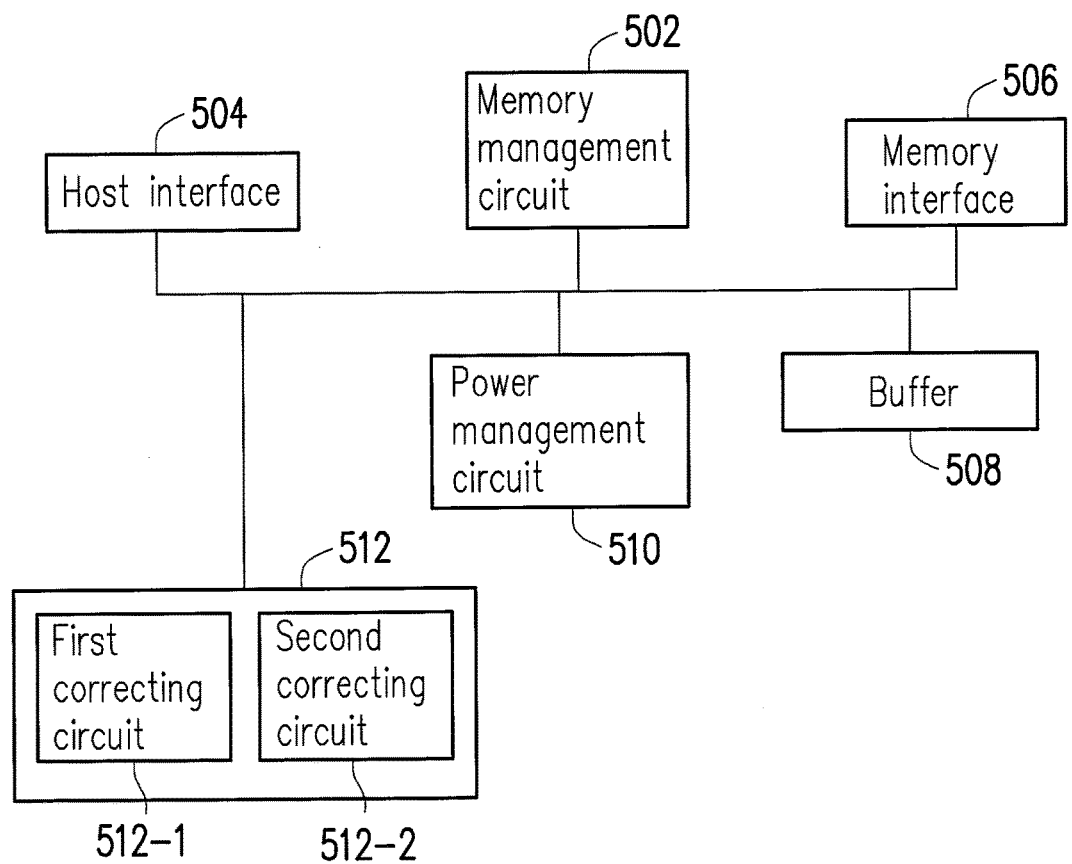
FIG. 5 is a schematic block diagram of a memory control circuit unit shown according to an exemplary embodiment.

FIG. 5 is a schematic block diagram of a memory control circuit unit shown according to an exemplary embodiment.

Referring to FIG. 5, the memory control circuit unit 404 includes a memory management circuit 502, a host interface 504 and a memory interface 506, a buffer 508, a power management circuit 510, and an error checking and correcting (ECC) circuit 512.

The memory management circuit 502 is configured to control the overall operation of the memory control circuit unit 404. Specifically, the memory management circuit 502 has a plurality of control instructions. During the operation of the memory storage device 10, the control instructions are executed to perform various data operations such as writing, reading, and erasing.

In the present exemplary embodiment, the control instructions of the memory management circuit 502 are implemented in firmware form. For instance, the memory management circuit 502 has a microprocessor unit (not shown) and a read-only memory (not shown), and the control instructions are burned into the ROM. During the operation of the memory storage device 10, the control instructions are executed by the microprocessor unit to perform data operations such as writing, reading, and erasing.

In another exemplary embodiment, the control instructions of the memory management circuit 502 may also be stored in the form of program codes into a specific area (for instance, the system area in a memory module exclusively configured to store system data) of the rewritable non-volatile memory module 406. Moreover, the memory management circuit 502 has a microprocessor unit (not shown), a ROM (not shown), and a RAM (not shown). In particular, the ROM has a boot code, and when the memory control circuit unit 404 is enabled, the microprocessor unit first executes the boot code to load the control instructions stored in the rewritable non-volatile memory module 406 into the RAM of the memory management circuit 502. Next, the microprocessor unit runs the control instructions to perform data operations such as writing, reading, and erasing.

Further, in another exemplary embodiment, the control instructions of the memory management circuit 502 may also be implemented in hardware form. For instance, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. In particular, the memory cell management circuit is configured to manage the physical erasing units of the rewritable non-volatile memory module 406; the memory write circuit is configured to issue a write command to the rewritable non-volatile memory module 406 to write data into the rewritable non-volatile memory module 406; the memory read circuit is configured to issue a read command to the rewritable non-volatile memory module 406 so as to read data from the rewritable non-volatile memory module 406; the memory erase circuit is configured to issue an erase command to the rewritable non-volatile memory module 406 to erase data from the rewritable non-volatile memory module 406; and the data processing circuit is configured to process data to be written into the rewritable non-volatile memory module 406 and read data from the rewritable non-volatile memory module 406.

The host interface 504 is coupled to the memory management circuit 502 and is configured to be coupled to the connection interface unit 402 so as to receive and identify commands and data sent by the host system 11. In other words, the commands and the data sent by the host system 11 are sent to the memory management circuit 502 through the host interface 504. In the present exemplary embodiment, the host interface 504 is compatible with the SATA standard. However, it should be understood that the invention is not limited thereto, and the host interface 504 may also be compatible with the PATA standard, IEEE 1394 standard, PCI Express standard, USB standard, UHS-I standard, UHS-II standard, SD standard, MS standard, MMC standard, CF standard, IDE standard, or other suitable data transmission standards.

The memory interface 506 is coupled to the memory management circuit 502 and is configured to access the rewritable non-volatile memory module 406. In other words, data to be written into the rewritable non-volatile memory module 406 is converted to a format acceptable to the rewritable non-volatile memory module 406 through the memory interface 506.

The buffer 508 is coupled to the memory management circuit 502 and is configured to temporarily store data and commands from the host system 11 or data from the rewritable non-volatile memory module 406.

The power management circuit 510 is coupled to the memory management circuit 502 and is configured to control the power of the memory storage device 10.

The ECC circuit 512 is coupled to the memory management circuit 502 and has a first correcting circuit 512-1 and a second correcting circuit 512-2 to execute an ECC process to ensure the correctness of data. Specifically, when the memory management circuit 502 receives a write command from the host system 11, the first correcting circuit 512-1 of the ECC circuit 512 generates a corresponding ECC code for the user data corresponding to the write command, and the memory management circuit 502 writes the data corresponding to the write command and the corresponding ECC code into the rewritable non-volatile memory module 406. Moreover, in the present exemplary embodiment, the second correcting circuit 514 generates at least one correcting code based on the user data of a plurality of physical programming units (the physical programming units can be referred to as one encoded group), and the memory management circuit 502 writes the generated correcting code into the rewritable non-volatile memory module 406. Next, when reading user data from the rewritable non-volatile memory module 406, the memory management circuit 502 also reads the ECC code corresponding to the data, and the ECC circuit 512 performs an ECC process on the read user data based on the ECC code. In particular, if the read user data cannot be successfully corrected using the corresponding ECC code, then the memory management circuit 502 reads the user data of the physical programming unit stored in the corresponding encoded group from the rewritable non-volatile memory module 406 and the corresponding correcting code, and the second correcting circuit 514 corrects the user data that the first correcting circuit 512-1 cannot successfully correct based on the user data of the other physical programming units inside the corresponding encoded group and the corresponding correcting code.

In other words, the basic unit of the first correcting circuit 512-1 of the ECC circuit 512 executing an encoding process is one frame and a single-frame encoding is performed on data stored in one physical programming unit. The second correcting circuit 514 of the ECC circuit 512 performs a multi-frame encoding on data stored in a plurality of physical programming units. Here, one frame includes a plurality of data bits. In the present exemplary embodiment, one frame includes 256 bits. However, in another exemplary embodiment, one frame may also include more or less bits. For instance, in the present exemplary embodiment, the single-frame encoding adopts a low density parity code (LDPC) encoding algorithm, a BCH code encoding algorithm, a convolutional code encoding algorithm, or a turbo code encoding algorithm, and the multi-frame encoding adopts a Reed-Solomon codes (RS codes) algorithm. It should be understood that, the above encoding algorithms are only exemplary, and in another exemplary embodiment, more encoding algorithms not listed above may also be adopted and are not repeated herein. Based on the adopted encoding algorithm, the ECC circuit 512 may encode data to be protected to generate a corresponding error correcting code and/or error checking code. In the present exemplary embodiment, the error correcting code and/or error checking code generated by the single-frame encoding is collectively referred to as a parity code, and the error correcting code and/or error checking code generated by the multi-frame encoding is collectively referred to as a group parity code.

Figure 6:
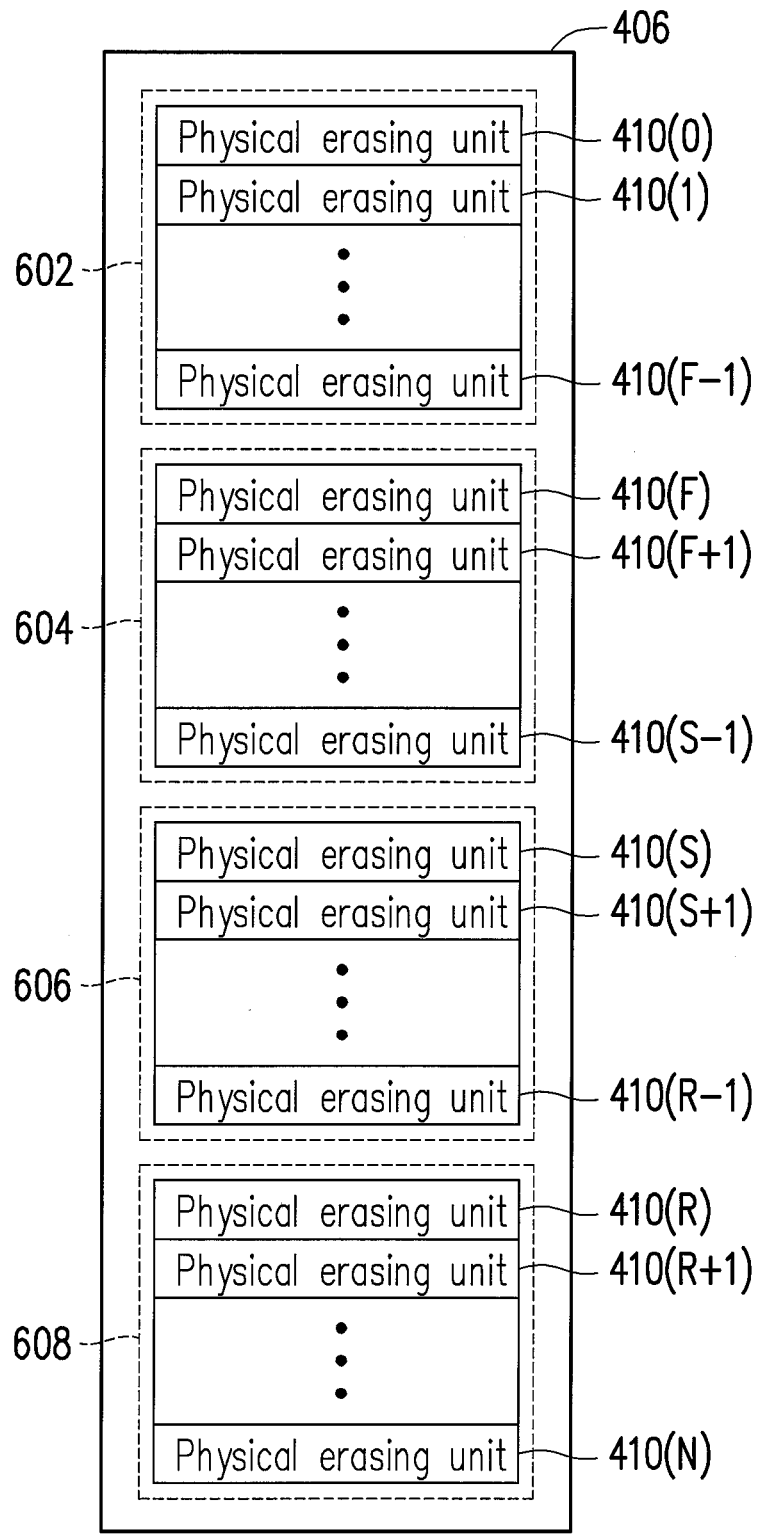
FIG. 6 and FIG. 7 are exemplary schematics of the management of a physical erasing unit shown according to an exemplary embodiment.
Figure 7:
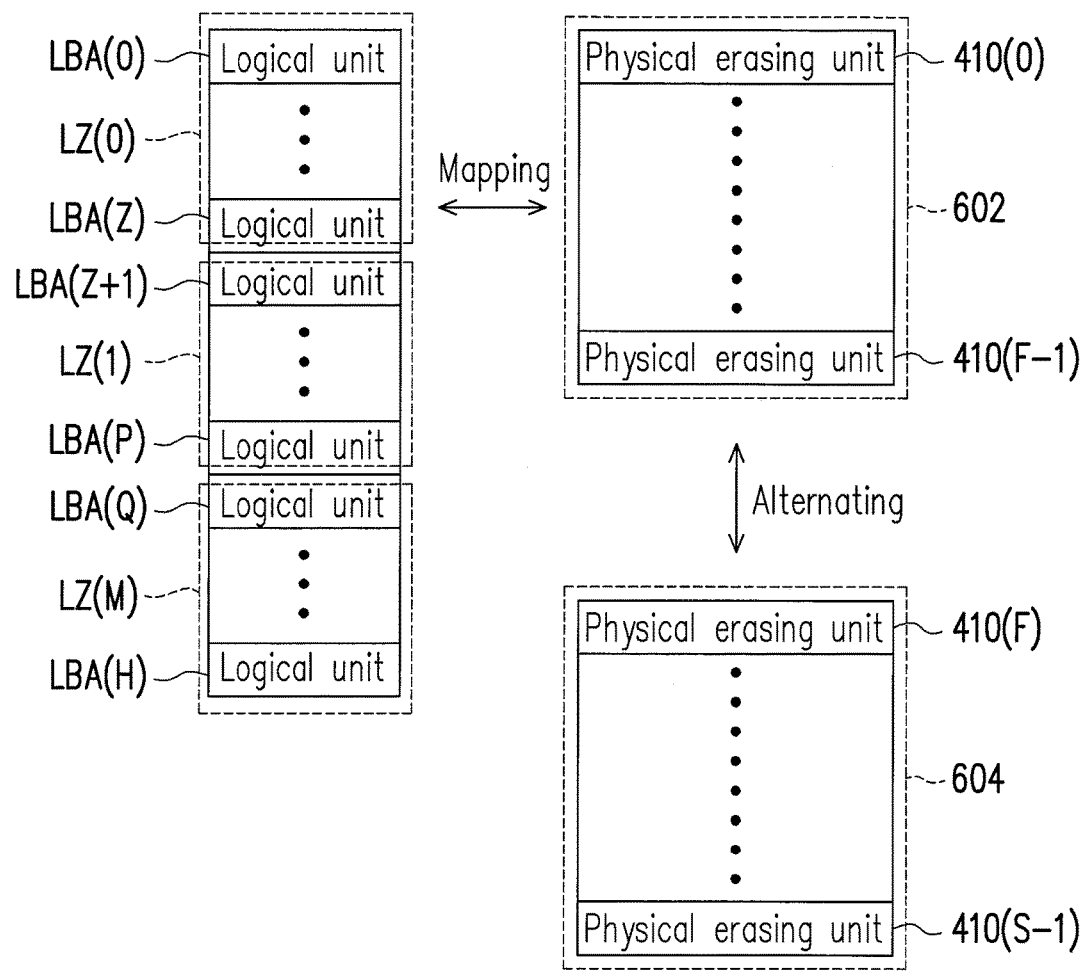

FIG. 6 and FIG. 7 are exemplary schematics of the management of a physical erasing unit shown according to an exemplary embodiment.

It should be understood that terms, such as "get", "retrieve", "group", "divide", "associate" and so forth, are logical concepts which describe operations in the physical erasing units of the rewritable non-volatile memory module 406. That is, the physical erasing units of the rewritable non-volatile memory module are logically operated, but actual positions of the physical units of the rewritable non-volatile memory module are not changed.

Referring to FIG. 6, the memory control circuit unit 404 (or the memory management circuit 502) logically groups the physical erasing units 410(0) to 410(N) into a data area 602, a spare area 604, a system area 606, and a replacement area 608.

The physical erasing units logically belonging to the data area 602 and the spare area 604 are configured to store data from the host system 11. Specifically, the physical erasing units of the data area 602 are regarded as physical erasing units in which data is stored, and the physical erasing units of the spare area 604 are configured to substitute the physical erasing units of the data area 602. In other words, when the host system 11 receives a write command and data to be written, the memory management circuit 502 gets the physical erasing units from the spare area 604, and writes data into the gotten physical erasing units to substitute the physical erasing units of the data area 602.

The physical erasing units logically belonging to the system area 606 are configured to record system data. For instance, the system data includes the manufacturer and the model of the rewritable non-volatile memory module, the quantity of physical erasing units of the rewritable non-volatile memory module, and the quantity of physical programming units of each of the physical erasing units.

The physical erasing units logically belonging to the replacement area 608 are configured for the replacement operation of damaged physical erasing units to replace damaged physical erasing units. Specifically, if the replacement area 608 still has normal physical erasing units and the physical erasing units of the data area 602 are damaged, then the memory management circuit 502 gets normal physical erasing units from the replacement area 608 to replace the damaged physical erasing units.

In particular, the quantities of the physical erasing units of the data area 602, the spare area 604, the system area 606, and the replacement area 608 are different according to different memory specifications. Moreover, it should be understood that, in the operation of the memory storage device 10, the grouping relationship of the physical erasing units to the data area 602, the spare area 604, the system area 606, and the replacement area 608 is dynamically changed. For instance, when the physical erasing units in the spare area 604 are damaged and replaced by the physical erasing units of the replacement area 608, the original physical erasing units of the replacement area 608 are associated to the spare area 604.

Referring to FIG. 7, the memory control circuit unit 404 (or the memory management circuit 502) configures logical units LBA(0) to LBA(H) to map the physical erasing units of the data area 602, wherein each logical unit has a plurality of logical sub-units to map the physical programming units of the corresponding physical erasing unit. Moreover, when the host system 11 is to write data into the logical units or update data stored in the logical units, the memory control circuit unit 404 (or the memory management circuit 502) gets one physical erasing unit from the spare area 604 to write data so as to rotate the physical erasing units of the data area 602. In the present exemplary embodiment, the logical sub-units can be logical pages or logical sectors.

To identify which physical erasing unit the data of each of the logical units is stored in, in the present exemplary embodiment, the memory control circuit unit 404 (or the memory management circuit 502) records the mapping between the logical units and the physical erasing units. Moreover, when the host system 11 is to access data in the logical sub-unit, the memory control circuit unit 404 (or the memory management circuit 502) confirms the logical unit that the logical sub-unit belongs to, and data is accessed in the physical erasing unit mapped by the logical unit. For instance, in the present exemplary embodiment, the memory control circuit unit 404 (or the memory management circuit 502) stores a logical address-physical address mapping table in the rewritable non-volatile memory module 406 to record the physical erasing units mapped by each of the logical units, and when data is to be accessed, the memory control circuit unit 404 (or the memory management circuit 502) loads the logical address-physical address mapping table to the buffer 508 for protection.

It should be mentioned that, since the capacity of the buffer 508 is limited and cannot store the mapping table recording the mapping relationships of all of the logical units, in the present exemplary embodiment, the memory control circuit unit 404 (or the memory management circuit 502) groups the logical units LBA(0) to LBA(H) into a plurality of logical areas LZ(0) to LZ(M), and allocates one logical address-physical address mapping table for each logical area. In particular, when the memory control circuit unit 404 (or the memory management circuit 502) is to update the mapping of a certain logical unit, the logical address-physical address mapping table corresponding to the logical area to which the logical unit belongs is loaded into the buffer 508 for update.

As described above, in the present exemplary embodiment, the data bit area of each physical programming unit of the rewritable non-volatile memory module 406 can store user data, and the redundancy area of each physical programming unit can store the parity code of a corresponding user data. In particular, the memory control circuit unit 404 (or the memory management circuit 502) further allocates (or groups) the physical programming units into a plurality of encoded groups (i.e., each encoded group may include one or a plurality of physical programming units). Furthermore, the ECC circuit 512 generates group parity codes respectively corresponding to each encoded group in addition based on data stored in the physical programming units grouped to the same encoded group. For instance, the memory control circuit unit 404 (or the ECC circuit 512) generates group parity codes corresponding to each encoded group based on data stored in the data bit areas of the physical programming units grouped to the same encoded group. Moreover, the memory control circuit unit 404 (or the memory management circuit 502) stores the group parity codes generated thereby in the physical programming units of the rewritable non-volatile memory module 406. Then, if the parity code of the redundancy area of the physical programming units cannot correct data read from the data bit area of the physical programming units, then the memory control circuit unit 404 (or the ECC circuit 512) may correct the read data using the corresponding group parity code.

Figure 8:
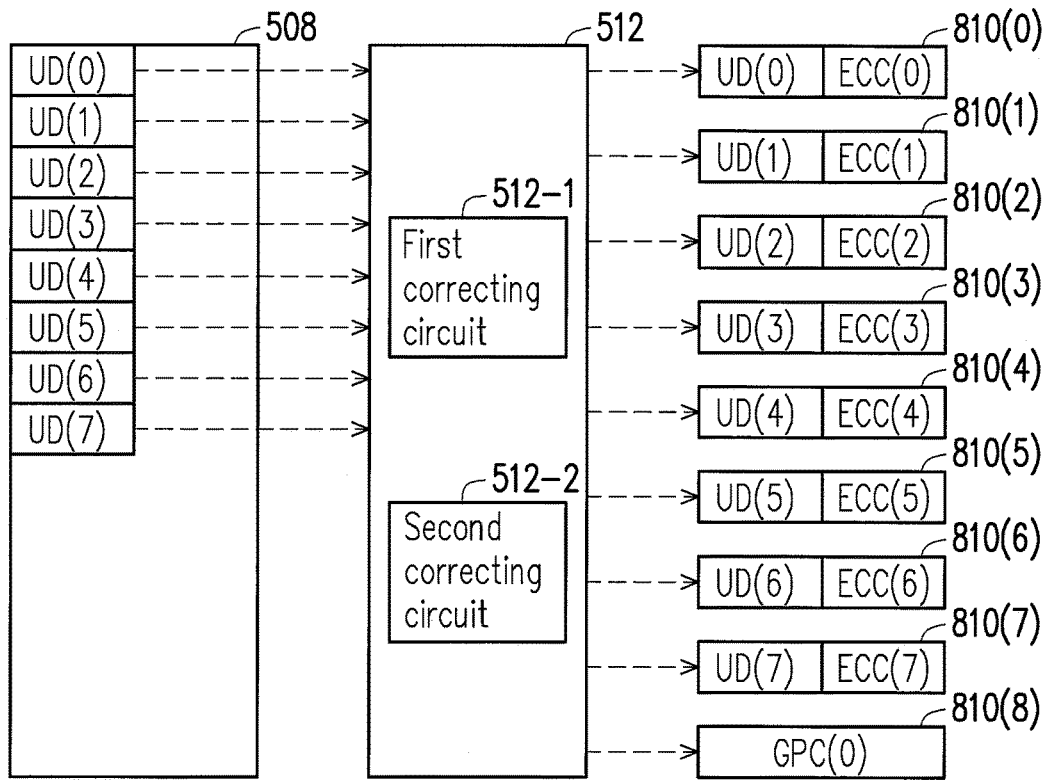
FIG. 8 is an example of writing data into a rewritable non-volatile memory module shown according to an exemplary embodiment.

FIG. 8 is an example of writing data into a rewritable non-volatile memory module shown according to an exemplary embodiment. In the case that physical programming units 810(0) to 810(7) of the physical erasing unit 410(0) are grouped into the same encoded group (first encoded group hereinafter) and receive a write command from the host system 11, the physical erasing unit 410(0) currently belonging to the spare area 604 is selected to be the active physical erasing unit for data writing.

Referring to FIG. 8, when a write command writing data from a certain logical address (i.e., logical sub-unit) and corresponding user data UD(0) to UD(7) are received from the host system 11, the memory control circuit unit 404 (or the memory management circuit 502) configures one temporary area in the buffer 508 first and temporarily stores the user data UD(0) to UD(7) in a temporary area configured in the buffer 508.

Then, the memory control circuit unit 404 (or the memory management circuit 502) sends the user data UD(0) and an encoding initialization command to the first correcting circuit 512-1 of the ECC circuit 512, and the first correcting circuit 512-1 generates a corresponding parity code ECC(0) based on the user data (0). Moreover, the memory control circuit unit 404 (or the memory management circuit 502) sends the user data UD(0) and an encoding initialization command to the second correcting circuit 512-2 of the ECC circuit 512, and the second correcting circuit 512-2 executes an encoding operation (i.e., encoding operation used in the above group encoding) based on the user data UD(0) and saves the operation results. After the parity code ECC(0) corresponding to the user data UD(0) is obtained, the memory control circuit unit 404 (or the memory management circuit 502) issues a write command sequence to write the user data UD(0) and the parity code ECC(0) into the physical programming unit 810(0).

Then, the memory control circuit unit 404 (or the memory management circuit 502) sends the user data UD(1) and an encoding initialization command to the first correcting circuit 512-1 of the ECC circuit 512, and the first correcting circuit 512-1 generates a corresponding parity code ECC(1) based on the user data (1). Moreover, the memory control circuit unit 404 (or the memory management circuit 502) sends the user data UD(1) to the second correcting circuit 512-2 of the ECC circuit 512, and the second correcting circuit 512-2 executes an encoding operation (i.e., encoding operation used in the above group encoding) based on the previous operation results and the user data UD(1) and saves the operation results. After the parity code ECC(1) corresponding to the user data UD(1) is obtained, the memory control circuit unit 404 (or the memory management circuit 502) issues a write command sequence to write the user data UD(1) and the parity code ECC(1) into the physical programming unit 810(1).

Then, in a similar manner, the memory control circuit unit 404 (or the memory management circuit 502) writes the user data UD(2) to UD(7) and the parity codes ECC(2) to ECC(7) into the physical programming units 810(2) to 810(7). In particular, after the write operation of the physical programming units of the first encoded group is complete, the memory control circuit unit 404 (or the memory management circuit 502) issues a command to obtain the operation results of the group encoding from the second correcting circuit 512-2 of the ECC circuit 512 as a group parity code GPC(0) of the first encoded group, and writes the group parity code GPC(0) into at least one other physical programming unit (such as a physical programming unit 810(8)).

It should be understood that, FIG. 8 is only an example, and in the present exemplary embodiment, one encoded group may contain an N number of user data and a corresponding M number of group parity codes, and the second correcting circuit 512-2 may correct the maximum of an X number of user data (i.e., the maximum number of data that can be corrected by the second correcting circuit 512-2 is X) based on the M number of group parity codes, wherein X, N, and M are set based on the adopted encoding algorithm, and the invention is not limited thereto. In particular, when more group parity codes are generated, the number of correctable data is greater.

Figure 9:
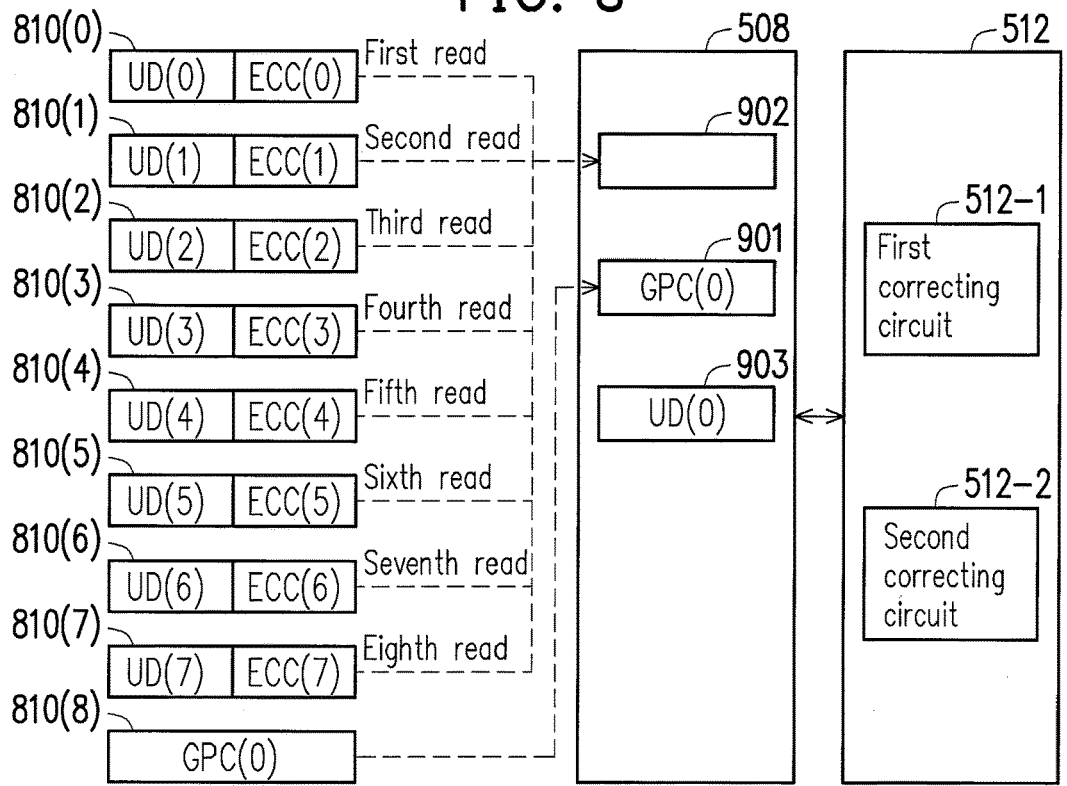
FIG. 9 is an example of reading data shown according to an exemplary embodiment.

FIG. 9 is an example of reading data shown according to an exemplary embodiment. Here, it is assumed that when a read command is received from the host system 11, user data is read from the physical programming unit 810(0).

Referring to FIG. 9, the memory control circuit unit 404 (or the memory management circuit 502) configures a temporary area (second temporary area 902 hereinafter) in the buffer 508 and temporarily stores the user data UD(0) and the parity code ECC(0) read from the physical programming unit 810(0) in a first temporary area 901 (i.e., first read). Here, the second temporary area 902 is configured to temporarily store the read user data of the physical programming unit, and the size thereof is set to the size of a T number of physical programming units, wherein the sum of T and X is less than N. For instance, in the example in which the user data of only 1 physical programming unit is processed each time, T is set to 1.

Then, the memory control circuit unit 404 (or the memory management circuit 502) sends the decoding initializing command, the user data UD(0), and the parity code ECC(0) to the first correcting circuit 512-1 of the ECC circuit 512 to perform an ECC operation (may also be referred to as first ECC operation). If the user data UD(0) may be corrected based on the parity code ECC(0), then the memory control circuit unit 404 (or the memory management circuit 502) sends the corrected user data UD(0) to the host system 11 in response to the received read command.

If the user data UD(0) cannot be corrected based on the parity code ECC(0), then the memory control circuit unit 404 (or the memory management circuit 502) executes an ECC operation (can also be referred to as second ECC operation) again using the group parity code to attempt to correct erroneous data.

Specifically, in the second ECC operation, the memory control circuit unit 404 (or the memory management circuit 502) allocates a temporary area (may be referred to as the first temporary area 901 hereinafter) in the buffer 508, and reads a first group parity code GPC(0) from the physical programming unit 810(8) and temporarily stores the first group parity code GPC(0) in the first temporary area 901. Here, the first temporary area 901 is configured to temporarily store the read group parity code, and the size thereof is set to the size of an M number of physical programming units. For instance, in the example of FIG. 8, in the example in which only 1 group parity code is generated in the encoding operation, M is set to 1. Moreover, the memory control circuit unit 404 (or the memory management circuit 502) allocates a temporary area (may be referred to as the third temporary area 903 hereinafter) in the buffer 508. Here, the third temporary area 903 is configured to temporarily store the user data corrected by the second correcting circuit, and the size thereof is set to the size of an X number of physical programming units. As described above, the M number of group parity codes can correct an X number of user data, and therefore the size of the third temporary area 903 can be set based on the maximum number of corrected user data that can be generated.

After the buffer 508 allocates a corresponding temporary area, the memory control circuit unit 404 (or the memory management circuit 502) reads the user data of the physical programming unit of the first encoded group and the corresponding parity code into the second temporary area 902 in batches. Specifically, since the size of the second temporary area 902 is only the size of one physical programming unit, the memory control circuit unit 404 (or the memory management circuit 502) only processes the data of one physical programming unit at a time.

In the present exemplary embodiment, the second correcting circuit 512-2 decodes the corrected user data and the group parity code received in batches to obtain one data to be used, wherein the data to be used can be a syndrome generated in the decoding process or other parameters for decoding. After the data to be used is obtained, the second correcting circuit 512-2 obtains the corrected user data corresponding to the user data using the data to be used, the user data, and the group parity code. For instance, in the example of FIG. 9, in the second ECC operation, the memory control circuit unit 404 (or the memory management circuit 502) sends the decoding initialization command and the first group parity code GPC(0) temporarily stored in the first temporary area 901 to the second correcting circuit 512-2. Then, the memory control circuit unit 404 (or the memory management circuit 502) reads the user data UD(1) and the parity code ECC(1) in the physical programming unit 810(1) into the second temporary area 902, and sends the user data UD(1) and the parity code ECC(1) in the physical programming unit 810(1) to the first correcting circuit 512-1. If the first correcting circuit 512-1 can correct the user data UD(1) based on the parity code ECC(1), then the memory control circuit unit 404 (or the memory management circuit 502) sends the corrected user data UD(1) to the second corrected circuit 512-2, and the second corrected circuit 512-2 executes a decoding operation based on the first group parity code and the user data UD(1) and saves the operation results. If the first correcting circuit 512-1 cannot correct the user data UD(1) based on the parity code ECC(1), then the user data is not entered into the second correcting circuit 512-2.

Then, the memory control circuit unit 404 (or the memory management circuit 502) reads the user data UD(2) and the parity code ECC(2) in the physical programming unit 810(2) into the second temporary area 902, and sends the user data UD(2) and the parity code ECC(2) in the physical programming unit 810(1) to the first correcting circuit 512-1. Similarly, if the first correcting circuit 512-1 can correct the user data UD(2) based on the parity code ECC(2), then the memory control circuit unit 404 (or the memory management circuit 502) sends the corrected user data UD(2) to the second correcting circuit 512-2, and the second correcting circuit 512-2 continues to perform the decoding operation based on the previous calculation results and the corrected user data UD(2) and saves the operation results.

Similarly, the memory control circuit unit 404 (or the memory management circuit 502) reads the user data UD(2) to UD(7) and the parity codes ECC(2) to ECC(7) in the physical programming units 810(3) to 810(7) into the second temporary area 902 in batches, and sends the user data UD(2) to UD(7) and the parity codes ECC(2) to ECC(7) in the physical programming units 810(3) to 810(7) to the first correcting circuit 512-1. If the user data UD(2) to UD(7) can be corrected, then the memory control circuit unit 404 (or the memory management circuit 502) sends the corrected user data to the second correcting circuit 512-2 to continue the decoding operation.

After the decoding operation is complete, the memory control circuit unit 404 (or the memory management circuit 502) sends a correction complete command to the second correcting circuit 512-2, and the second correcting circuit 512-2 outputs the corrected user data. Specifically, in the case that the number of erroneous data in the user data UD(0) to UD(7) is less than the maximum number of data that can be corrected by the second correcting circuit 512-2, the second correcting circuit 512-2 can output the correction user data of the error user data in the decoding operation. In the example of FIG. 9, in the case that the user data UD(0) cannot be corrected by the first correcting circuit 512-1 and the user data UD(1) to UD(7) can be corrected by the first correcting circuit 512-1 and inputted into the second correcting circuit 512-2, the second correcting circuit 512-2 can output the corrected user data UD(0) based on the first group parity code GPC(0) and the user data UD(1) to UD(7).

It should be mentioned that, in the present exemplary embodiment, when the second ECC operation is performed, since the memory control circuit unit 404 (or the memory management circuit 502) reads the user data from the physical programming units in batches, the second temporary area 902 allocated by the buffer 508 is only the size of the physical programming unit read in batches (such as the size of 1 physical programming unit), and a large amount of storage space (such as enough space to store the user data of all of the physical programming units of the encoded group) does not need to be allocated. Therefore, the second ECC operation can be executed under limited capacity of the buffer 508.

Figure 10:
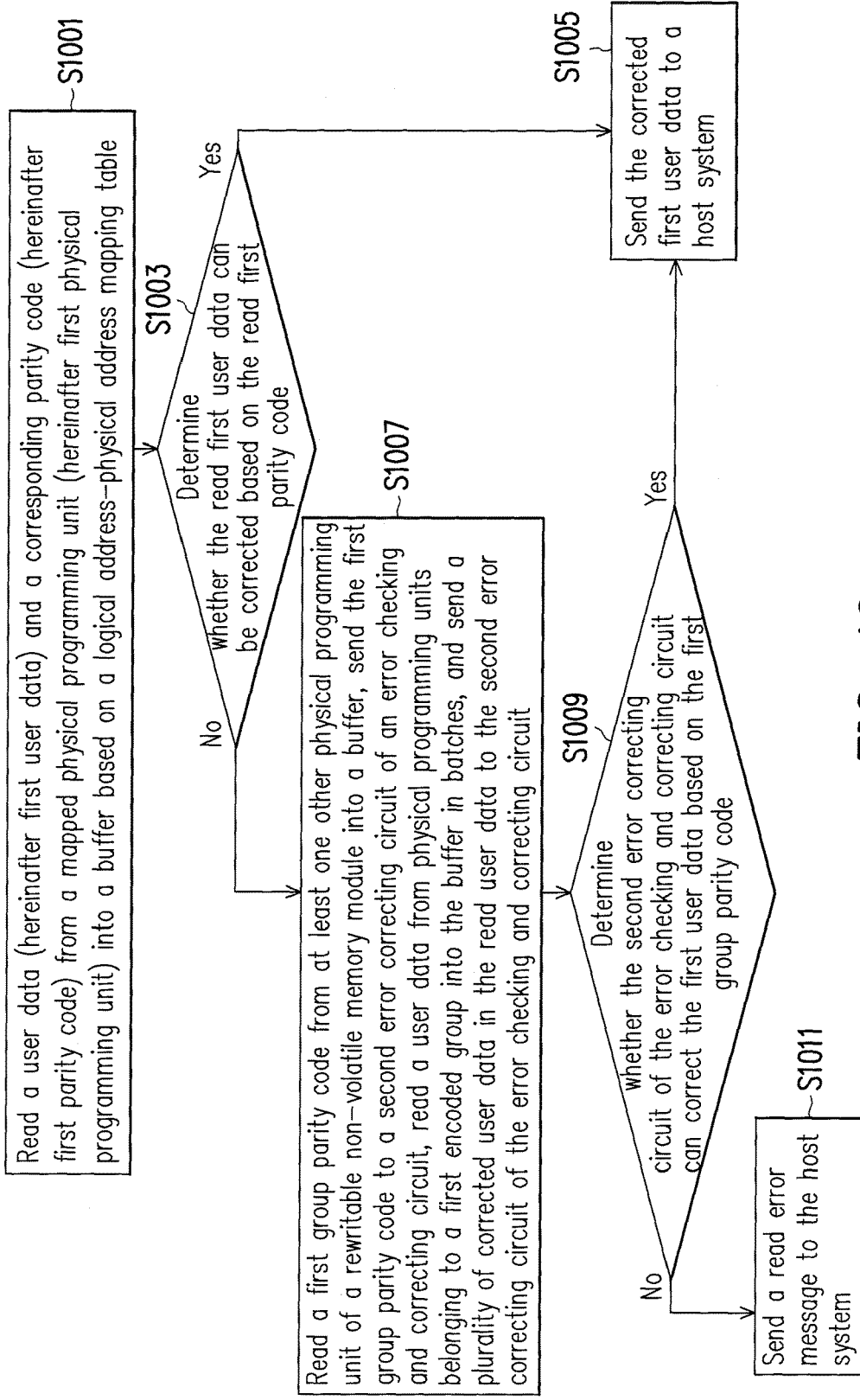
FIG. 10 is a flow chart of a data correcting method shown according to an exemplary embodiment.

FIG. 10 is a flow chart of a data correcting method shown according to an exemplary embodiment.

Referring to FIG. 10, when the memory storage device 10 receives a read command from the host system 11, in step S1001, the memory control circuit unit 404 (or the memory management circuit 502) reads the user data (hereinafter first user data) and the corresponding parity code (hereinafter first parity code) into the buffer 508 from the mapped physical programming unit (hereinafter first physical programming unit) based on a logical address-physical address mapping table.

In step S1003, the memory control circuit unit 404 (or the memory management circuit 502) determines whether the read first user data can be corrected based on the read first parity code. Specifically, the memory control circuit unit 404 (or the memory management circuit 502) sends the first user data and the first parity code to the ECC circuit 512 to perform an error correcting operation (i.e., the first error correcting operation). The detailed operating method is as described in detail above and is not repeated herein.

If the read first user data can be corrected based on the read first parity code, then in step S1005, the memory control circuit unit 404 (or the memory management circuit 502) sends the corrected first user data to the host system 11.

If the read first user data cannot be corrected based on the read first parity code, then in step S1007, the memory control circuit unit 404 (or the memory management circuit 502) reads the first group parity code GPC(0) from at least one other physical programming unit of the rewritable non-volatile memory module 406 into the buffer 508, sends the first group parity code GPC(0) to the second error correcting circuit 512-2 of the ECC circuit 512, reads the user data from the physical programming units belonging to the first encoded group into the buffer 508 in batches, and sends a plurality of corrected user data in the read user data to the second error correcting circuit 512-2 of the ECC circuit 512. The method of reading and sending the corrected user data of the physical programming units belonging to the same encoded group to the second error correcting circuit 512-2 of the ECC circuit 512 in batches is as described with reference to FIG. 9 and is not repeated herein.

In step S1009, the memory control circuit unit 404 (or the memory management circuit 502) determines whether the second error correcting circuit 512-2 of the ECC circuit 512 can correct the first user data based on the first group parity code.

If the second error correcting circuit 512-2 can correct the first user data based on the first group parity code, then step S1005 is executed.

If the second error correcting circuit 512-2 cannot correct the first user data based on the first group parity code, then in step 51011, the memory control circuit unit 404 (or the memory management circuit 502) sends a read error message to the host system 11.

Based on the above, when the data correcting method, the memory control circuit unit, and the memory storage device of the invention cannot correct data read from the physical programming units based on the corresponding parity code thereof, correction can be further performed based on the group parity code stored in another physical programming unit. Moreover, when the data correcting method, the memory control circuit unit, and the memory storage device of the invention correct data using the group parity codes corresponding to a plurality of physical programming units, data correction can be completed using a small amount of buffer space to effectively reduce the cost of the memory storage device. The previously described exemplary embodiments of the present invention have the advantages aforementioned, wherein the advantages aforementioned not required in all versions of the invention.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A data correcting method for a rewritable non-volatile memory module, wherein the rewritable non-volatile memory module comprises a plurality of physical programming units, and the physical programming units are grouped into a plurality of encoded groups, the data correcting method comprising:
   reading first user data from a first physical programming unit in the physical programming units and a first parity code corresponding to the first user data into a buffer, wherein the first physical programming unit belongs to a first encoded group in the encoded groups;
   reading at least one first group parity code from at least one other physical programming unit in the physical programming units into the buffer so as to send the at least one first group parity code to a second correcting circuit, and reading the user data from physical programming units belonging to the first encoded group into the buffer in batches so as to send a plurality of corrected user data in the read user data to the second correcting circuit if a first correcting circuit cannot correct the first user data read from the first physical programming unit based on the read first parity code, wherein the at least one first group parity code is generated by encoding a plurality of user data stored in the physical programming units belonging to the first encoded group;
   decoding the corrected user data and the at least one first group parity code in batches via the second correcting circuit to obtain a corrected first user data corresponding to the first user data; and
   outputting the corrected first user data corresponding to the first user data via the second correcting circuit.

2. The data correcting method of claim 1, wherein the step of decoding the corrected user data and the at least one first group parity code in batches via the second correcting circuit to obtain the corrected first user data corresponding to the first user data comprises:
   decoding the corrected user data and the at least one first group parity code in batches via the second correcting circuit to obtain data to be used; and
   obtaining the corrected first user data corresponding to the first user data by using the data to be used, the first user data, and the at least one first group parity code via the second correcting circuit.

3. The data correcting method of claim 1, further comprising:
   allocating a first temporary area in the buffer, wherein the first temporary area temporarily stores the at least one first group parity code;
   allocating a second temporary area in the buffer, wherein the second temporary area temporarily stores the user data read from the physical programming units of the first encoded group in batches; and
   allocating a third temporary area in the buffer, wherein the third temporary area temporarily stores the corrected first user data corresponding to the first user data,
   wherein the size of the second temporary area is less than a capacity of all of the physical programming units belonging to the first encoded group.

4. The data correcting method of claim 3, wherein the number of the physical programming units belonging to the first encoded group is N, the number of the at least one first group parity code is M, the size of the first temporary area is a storage capacity of an M number of physical programming units, the size of the second temporary area is a storage capacity of a T number of physical programming units, and the size of the third temporary area is a storage capacity of an X number of physical programming units, wherein X is the maximum number of data that can be corrected by the second correcting circuit and N is greater than a sum of X and T.

5. The data correcting method of claim 4, wherein T is 1.

6. The data correcting method of claim 5, wherein the step of reading the at least one first group parity code from the at least one other physical programming unit in the physical programming units into the buffer so as to send the at least one first group parity code to the second correcting circuit, and reading the user data from the physical programming units belonging to the first encoded group into the buffer in batches so as to send the corrected user data in the read user data to the second correcting circuit comprises:
   (a) reading the at least one first group parity code from the at least one other physical programming unit into the buffer;
   (b) sending a decoding initialization command to the second correcting circuit;
   (c) sending the at least one first group parity code from the buffer to the second correcting circuit;
   (d) selecting one physical programming unit from the physical programming units of the first encoded group in order and reading a corresponding user data and a corresponding parity code from the selected physical programming unit;
   (e) sending corrected user data generated to the second correcting circuit if the corresponding user data read can be corrected based on the read parity code to generate the corrected user data; and
   (f) determining whether all of the physical programming units of the first encoded group are selected, wherein if at least one of the physical programming units of the first encoded group is not selected, step (d), step (e), and step (f) are repeated, and corrected first user data corresponding to the first user data is obtained from the second correcting circuit if all of the physical programming units of the first encoded group are selected.

7. A memory control circuit unit for controlling a rewritable non-volatile memory module, wherein the rewritable non-volatile memory module comprises a plurality of physical programming units, and the memory control circuit unit comprises:
a host interface configured to be coupled to a host system;
a memory interface configured to be coupled to the rewritable non-volatile memory module;
an error checking and correcting circuit comprising a first correcting circuit and a second correcting circuit;
a buffer; and
a memory management circuit coupled to the host interface, the error checking and correcting circuit, the memory interface, the error checking and correcting circuit, and the buffer,
wherein the memory management circuit is configured to group the physical programming units into a plurality of encoded groups;
wherein the memory management circuit is further configured to read first user data from a first physical programming unit in the physical programming units and a first parity code corresponding to the first user data into the buffer, wherein the first physical programming unit belongs to a first encoded group in the encoded groups;
wherein the first correcting circuit of the error checking and correcting circuit is configured to correct the first user data based of the first parity code;
wherein if the first correcting circuit cannot correct the read first user data from the first physical programming unit based on the read first parity code, the memory management circuit is further configured to read at least one first group parity code from at least one other physical programming unit in the physical programming units into the buffer so as to send the at least one first group parity code to the second correcting circuit, and read the user data from the physical programming units belonging to the first encoded group into the buffer in batches so as to send a plurality of corrected user data in the read user data to the second correcting circuit, and the second correcting circuit decodes the corrected user data and the at least one first group parity code in batches to obtain a corrected first user data corresponding to the first user data, wherein the at least one first group parity code is generated by encoding a plurality of user data stored in the physical programming units belonging to the first encoded group;
wherein the memory management circuit is further configured to output the corrected first user data corresponding to the first user data received from the second correcting circuit to the host system.

8. The memory control circuit unit of claim 7, wherein in the operation of decoding the corrected user data and the at least one first group parity code in batches to obtain the corrected first user data corresponding to the first user data, the second correcting circuit decodes the corrected user data and the at least one first group parity code in batches to obtain data to be used, and obtains the corrected first user data corresponding to the first user data by using the data to be used, the first user data, and the at least one first group parity code.

9. The memory control circuit unit of claim 7, wherein the memory management circuit allocates a first temporary area, a second temporary area, and a third temporary area in the buffer,
wherein the first temporary area temporarily stores the at least one first group parity code, the second temporary area temporarily stores the user data read from the physical programming units of the first encoded group in batches, and the third temporary area temporarily stores the corrected first user data corresponding to the first user data,
wherein the size of the second temporary area is less than a capacity of all of the physical programming units belonging to the first encoded group.

10. The memory control circuit unit of claim 9, wherein the number of the physical programming units belonging to the first encoded group is N, the number of the at least one first group parity code is M, the size of the first temporary area is a storage capacity of an M number of physical programming units, the size of the second temporary area is a storage capacity of a T number of physical programming units, and the size of the third temporary area is a storage capacity of an X number of physical programming units, wherein X is the maximum number of data that can be corrected by the second correcting circuit and N is greater than a sum of X and T.

11. The memory control circuit unit of claim 10, wherein T is 1.

12. The memory control circuit unit of claim 11, wherein in the operation of reading the at least one first group parity code from the at least one other physical programming unit in the physical programming units into the buffer so as to send the at least one first group parity code to the second correcting circuit, and reading the user data from the physical programming units belonging to the first encoded group into the buffer in batches so as to send the corrected user data in the read user data to the second correcting circuit, the memory management circuit performs the following operations:
(a) reading the at least one first group parity code from the at least one other physical programming unit into the buffer;
(b) sending a decoding initialization command to the second correcting circuit;
(c) sending the at least one first group parity code from the buffer to the second correcting circuit;
(d) selecting one physical programming unit from the physical programming units of the first encoded group in order and reading a corresponding user data and a corresponding parity code from the selected physical programming unit;
(e) sending corrected user data generated to the second correcting circuit if the corresponding user data read can be corrected based on the read parity code to generate the corrected user data; and
(f) determining whether all of the physical programming units of the first encoded group are selected, wherein if at least one of the physical programming units of the first encoded group is not selected, step (d), step (e), and step (f) are repeated, and a corrected first user data corresponding to the first user data is obtained from the second correcting circuit if all of the physical programming units of the first encoded group are selected.

13. A memory storage device, comprising:
a connection interface unit configured to be coupled to a host system;

a rewritable non-volatile memory module having a plurality of physical programming units; and a memory control circuit unit coupled to the connection interface unit and the rewritable non-volatile memory module, wherein the memory control circuit unit comprises an error checking and correcting circuit having a first correcting circuit and a second correcting circuit, a buffer, and a memory management circuit, wherein the memory management circuit is configured to group the physical programming units into a plurality of encoded groups;

wherein the memory management circuit is further configured to read first user data from a first physical programming unit in the physical programming units and a first parity code corresponding to the first user data into a buffer, wherein the first physical programming unit belongs to a first encoded group in the encoded groups;

wherein the first correcting circuit of the error checking and correcting circuit is configured to correct the first user data based of the first parity code;

wherein if the first correcting circuit cannot correct the read first user data from the first physical programming unit based on the read first parity code, then the memory management circuit is further configured to read at least one first group parity code from at least one other physical programming unit in the physical programming units into the buffer so as to send the at least one first group parity code to the second correcting circuit, and read the user data from the physical programming units belonging to the first encoded group into the buffer in batches so as to send a plurality of corrected user data in the read user data to the second correcting circuit, and the second correcting circuit decodes the corrected user data and the at least one first group parity code in batches to obtain a corrected first user data corresponding to the first user data, wherein the at least one first group parity code is generated by encoding a plurality of user data stored in the physical programming units belonging to the first encoded group;

wherein the memory management circuit is further configured to output the corrected first user data corresponding to the first user data received from the second correcting circuit to the host system.

14. The memory storage device of claim 13, wherein in the operation in which the corrected user data and the at least one first group parity code are decoded in batches to obtain the corrected first user data corresponding to the first user data, the second correcting circuit decodes the corrected user data and the at least one first group parity code to obtain data to be used, and obtains the corrected first user data corresponding to the first user data by using the data to be used, the first user data, and the at least one first group parity code.

15. The memory storage device of claim 13, wherein the memory management circuit allocates a first temporary area, a second temporary area, and a third temporary area in the buffer, wherein the first temporary area temporarily stores the at least one first group parity code, the second temporary area temporarily stores the user data read from the physical programming units of the first encoded group in batches, and the third temporary area temporarily stores the corrected first user data corresponding to the first user data, wherein the size of the second temporary area is less than a capacity of all of the physical programming units belonging to the first encoded group.

16. The memory storage device of claim 15, wherein the number of the physical programming units belonging to the first encoded group is N, the number of the at least one first group parity code is M, the size of the first temporary area is a storage capacity of an M number of physical programming units, the size of the second temporary area is a storage capacity of a T number of physical programming units, and the size of the third temporary area is a storage capacity of an X number of physical programming units, wherein X is the maximum number of data that can be corrected by the second correcting circuit and N is greater than a sum of X and T.

17. The memory storage device of claim 16, wherein T is 1.

18. The memory storage device of claim 17, wherein in the operation of reading the at least one first group parity code from the at least one other physical programming unit in the physical programming units into the buffer so as to send the at least one first group parity code to the second correcting circuit, and reading the user data from the physical programming units belonging to the first encoded group into the buffer so as to send the corrected user data in the read user data to the second correcting circuit, the memory management circuit performs the following operations:

(a) reading the at least one first group parity code from the at least one other physical programming unit into the buffer;

(b) sending a decoding initialization command to the second correcting circuit;

(c) sending the at least one first group parity code from the buffer to the second correcting circuit;

(d) selecting one physical programming unit from the physical programming units of the first encoded group in order and reading a corresponding user data and a corresponding parity code from the selected physical programming unit;

(e) sending corrected user data generated to the second correcting circuit if the corresponding user data read can be corrected based on the read parity code to generate the corrected user data; and (f) determining whether all of the physical programming units of the first encoded group are selected, wherein if at least one physical programming unit of the first encoded group is not selected, step (d), step (e), and step (f) are repeated, and a corrected first user data corresponding to the first user data is obtained from the second correcting circuit if all of the physical programming units of the first encoded group are selected.

* * * * *